(12) United States Patent
Gulati et al.

(10) Patent No.: US 10,389,379 B2
(45) Date of Patent: Aug. 20, 2019

(54) ERROR CORRECTING CODE TESTING

(71) Applicant: QUALCOMM Incorporated, San Diego, CA (US)

(72) Inventors: Rahul Gulati, San Diego, CA (US); Palkesh Jain, Bangalore (IN); Pranjal Bhuyan, San Diego, CA (US); Mohammad Reza Kakoee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 330 days.

(21) Appl. No.: 15/594,322

(22) Filed: May 12, 2017

(65) Prior Publication Data
US 2018/0331692 A1 Nov. 15, 2018

(51) Int. Cl.
*H03M 13/01* (2006.01)
*H03M 13/00* (2006.01)
*G06F 11/22* (2006.01)

(52) U.S. Cl.
CPC ....... *H03M 13/015* (2013.01); *G06F 11/2215* (2013.01); *H03M 13/6566* (2013.01)

(58) Field of Classification Search
CPC ............ H03M 13/015; H03M 13/6566; G06F 11/2215
See application file for complete search history.

(56) References Cited

U.S. PATENT DOCUMENTS

| | | | |
|---|---|---|---|
| 5,502,732 A | 3/1996 | Arroyo et al. | |
| 7,266,735 B2 | 9/2007 | Hirabayashi | |
| 8,914,687 B2 | 12/2014 | Gold et al. | |
| 2007/0255981 A1* | 11/2007 | Eto | G06F 11/1008 714/710 |
| 2008/0016415 A1* | 1/2008 | Ide | G06F 11/2215 714/702 |
| 2009/0049364 A1* | 2/2009 | Jo | G06F 11/1072 714/763 |
| 2009/0249148 A1 | 10/2009 | Ito et al. | |
| 2011/0219266 A1 | 9/2011 | Rao et al. | |

(Continued)

FOREIGN PATENT DOCUMENTS

| | | | | |
|---|---|---|---|---|
| EP | 2677429 A1 | 12/2013 | | |
| WO | WO-2013189896 A1 * | 12/2013 | ............ | G06F 11/102 |

OTHER PUBLICATIONS

International Search Report and Written Opinion—PCT/US2018/018791—ISA/EPO—dated Apr. 23, 2018.

*Primary Examiner* — Kyle Vallecillo
(74) *Attorney, Agent, or Firm* — Patterson & Sheridan, LLP (57) ABSTRACT

Various additional and alternative aspects are described herein. In some aspects, the present disclosure provides a method of testing error-correcting code (ECC) logic. The method includes receiving data for storage in a memory. The method further includes receiving an address indicating a location in the memory to store the data. The method further includes determining if the received address matches at least one of one or more test addresses. The method further includes operating the ECC logic in a normal mode when the received address does not match at least one of the one or more test addresses. The method further includes operating the ECC logic in a test mode when the received address does match at least one of the one or more test addresses.

30 Claims, 5 Drawing Sheets

(56) References Cited

U.S. PATENT DOCUMENTS

| | | | |
|---|---|---|---|
| 2014/0245105 A1* | 8/2014 | Chung | G06F 11/1048 |
| | | | 714/763 |
| 2014/0281693 A1* | 9/2014 | Jeddeloh | G06F 11/2017 |
| | | | 714/6.32 |
| 2014/0372814 A1 | 12/2014 | Oberlaender | |
| 2016/0155515 A1* | 6/2016 | Son | G11C 29/4401 |
| | | | 714/719 |
| 2016/0292059 A1 | 10/2016 | Catherwood et al. | |

* cited by examiner

ERROR CORRECTING CODE TESTING

TECHNICAL FIELD

The teachings of the present disclosure relate generally to techniques for testing memory, and more particularly, to testing functionality of an error correcting code of a memory.

INTRODUCTION

Advances in electronic device technology have resulted in smaller device features and lower supply voltages to reduce the power consumption and extend battery life. One result of this trend is that an amount of charge called "critical charge" required to indicate a unit of data, such as a data bit stored at a memory, has become more susceptible to corruption due to noise, and may actually change to the opposite state. For memory subsystems, this is unacceptable as every memory cell is required to retain its data for proper functionality.

Various schemes have been implemented to detect, correct, and otherwise reduce the impact of such data errors. For example, an error correcting code (ECC) process (e.g., implemented as an ECC logic) may be configured to process data (to be written to the memory) using multiple exclusive-OR (XOR) trees to generate check bits that indicate the parity of the received data. The check bits are used with XOR trees to generate syndrome bits indicative of errors detected in the data. The detected errors are then corrected to restore the original data.

For example, computing systems, including system-on-chip (SoC) integrated circuits may utilize memory that is both on-chip (e.g., buffers, static random access memory (SRAM), etc.) and off-chip (e.g., dynamic random access memory (DRAM), etc.) from the central processing unit(s) (CPU) of the computing system. In certain cases, these different memories may be protected via ECC processes. The ECC processes may be implemented in logic (e.g., a controller, circuit, etc.) coupled to the memory. In particular, the memory may be referred to as ECC memory, and may be capable of detecting and correcting most common kinds of internal data corruption.

ECC memory may be used in applications where integrity of stored data is critical. For example, in automotive advanced driver assistance systems (ADAS) (e.g., self-driving car technologies) storage of certain information, such as related to passenger or object detection, may need to be ensured as correct to avoid accidents and injuries. In certain aspects, such an error correction scheme may itself be subject to defects during manufacturing or operation and malfunction. Accordingly, certain aspects relate to performing testing of the ECC logic of a memory.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In some aspects, the present disclosure provides a method of testing error-correcting code (ECC) logic. The method includes receiving data for storage in a memory. The method further includes receiving an address indicating a location in the memory to store the data. The method further includes determining if the received address matches at least one of one or more test addresses. The method further includes operating the ECC logic in a normal mode when the received address does not match at least one of the one or more test addresses. The method further includes operating the ECC logic in a test mode when the received address does match at least one of the one or more test addresses.

In some aspects, the present disclosure provides a memory module for testing error-correcting code (ECC) logic. The memory module includes means for receiving data for storage in a memory. The memory module further includes means for receiving an address indicating a location in the memory to store the data. The memory module further includes means for determining if the received address matches at least one of one or more test addresses. The memory module further includes means for operating the ECC logic in a normal mode when the received address does not match at least one of the one or more test addresses. The memory module further includes means for operating the ECC logic in a test mode when the received address does match at least one of the one or more test addresses.

In some aspects, the present disclosure provides a computer readable medium having instructions stored thereon for causing a memory module to perform a method of testing error-correcting code (ECC) logic. The method includes receiving data for storage in a memory. The method further includes receiving an address indicating a location in the memory to store the data. The method further includes determining if the received address matches at least one of one or more test addresses. The method further includes operating the ECC logic in a normal mode when the received address does not match at least one of the one or more test addresses. The method further includes operating the ECC logic in a test mode when the received address does match at least one of the one or more test addresses.

In some aspects, the present disclosure provides a memory module for testing error-correcting code (ECC) logic. The memory module includes an ECC logic configured to receive data for storage in a memory. The memory module further includes an ECC module configured to receive an address indicating a location in the memory to store the data. The ECC module is further configured to determine if the received address matches at least one of one or more test addresses. The ECC module is further configured to operate the ECC logic in a normal mode when the received address does not match at least one of the one or more test addresses. The ECC module is further configured to operate the ECC logic in a test mode when the received address does match at least one of the one or more test addresses.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Although the teachings of this disclosure are illustrated in terms of integrated circuits (e.g., a SoC), the teachings are applicable in other areas. The teachings disclosed should not be construed to be limited to SoC designs or the illustrated embodiments. The illustrated embodiments are merely vehicles to describe and illustrate examples of the inventive teachings disclosed herein.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDA's), wireless electronic mail receivers, multimedia Internet enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors, modem processors, video processors, etc.), memory blocks (e.g., ROM, RAM, Flash, etc.), and resources (e.g., timers, voltage regulators, oscillators, etc.), any or all of which may be included in one or more cores.

A number of different types of memories and memory technologies are available or contemplated in the future, all of which are suitable for use with the various aspects. Such memory technologies/types include phase change memory (PRAM), dynamic random-access memory (DRAM), static random-access memory (SRAM), non-volatile random-access memory (NVRAM), pseudostatic random-access memory (PSRAM), double data rate synchronous dynamic random-access memory (DDR SDRAM), and other random-access memory (RAM) and read-only memory (ROM) technologies known in the art. A DDR SDRAM memory may be a DDR type 1 SDRAM memory, DDR type 2 SDRAM memory, DDR type 3 SDRAM memory, or a DDR type 4 SDRAM memory. Each of the above-mentioned memory technologies include, for example, elements suitable for storing instructions, programs, control signals, and/or data for use in or by a computer or other digital electronic device. Any references to terminology and/or technical details related to an individual type of memory, interface, standard or memory technology are for illustrative purposes only, and not intended to limit the scope of the claims to a particular memory system or technology unless specifically recited in the claim language.

Certain aspects of the present disclosure propose techniques for testing ECC logic of an ECC memory. For example, in order to ensure that ECC processes of an ECC memory are operating correctly and detecting and correcting errors, the ECC logic itself of the ECC memory may be tested. In certain aspects, the ECC logic may be tested using a dedicated self-test mode where the ECC logic is disabled, errors are introduced in the data stored in the memory, and the ECC logic is re-enabled. It is then tested if upon re-enabling the ECC logic, the ECC logic detects the error in the ECC memory. Such a dedicated self-test mode impacts normal functioning of the memory and the functions (e.g., safety functions) that rely on the memory, as the memory is unavailable for use during the dedicated self-test mode.

In certain aspects, the entire ECC logic is duplicated and the two ECC logics are operated together (e.g., in lock step). This requires additional costs (e.g., silicon area, bill of materials (BOM), etc.) to implement the additional ECC logic and comparator logic to compare the functioning of the two different ECC logics. Accordingly, certain aspects of the present disclosure relate to an ECC logic test process that operates during runtime of the ECC memory, and further does not require duplication of ECC logic.

The various aspects may be implemented in a wide variety of computing systems, including single processor systems, multi-processor systems, multicore processor systems, systems-on-chip (SoC), or any combination thereof.

Figure 1:
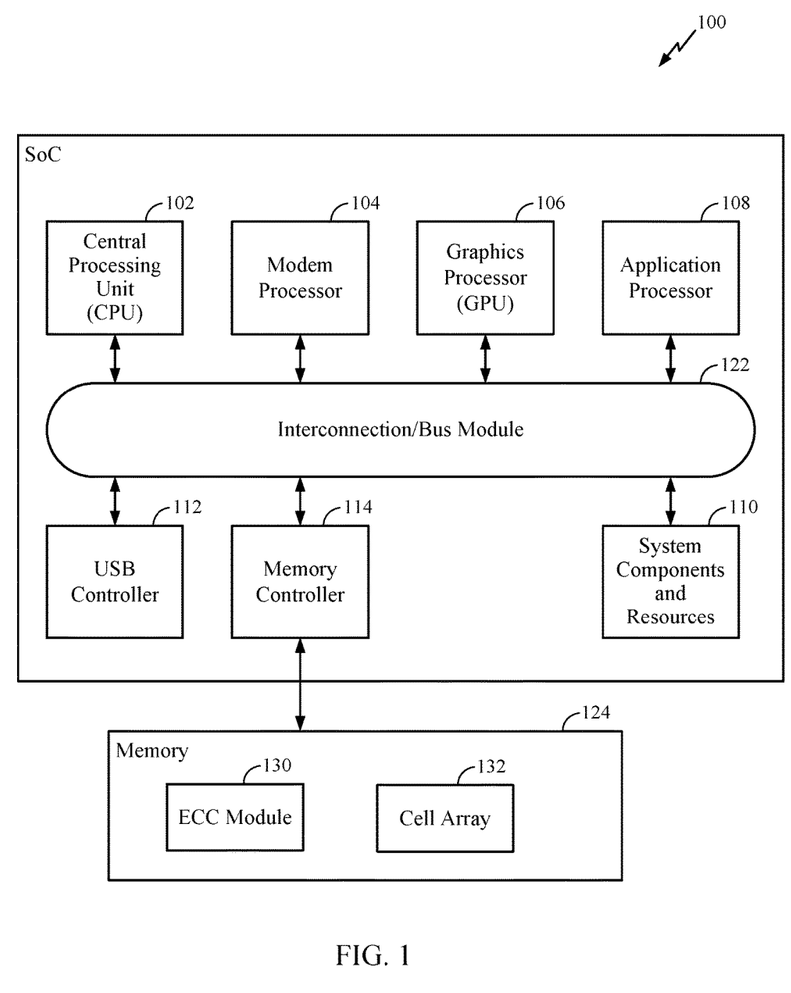
FIG. 1 illustrates example components and interconnections in a system-on-chip (SoC) coupled to a volatile memory suitable for implementing various aspects of the present disclosure.

FIG. 1 illustrates example components and interconnections in a system-on-chip (SoC) 100 coupled to a volatile memory 124 (e.g., dynamic random access memory (DRAM), ECC memory, etc.) suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that they may operate at a much higher frequency/clock-rate than would be possible if the signals were to travel off-chip. The proximity of the cores may also allow for the sharing of on-chip memory and resources (e.g., voltage rail), as well as for more coordinated cooperation between cores.

The SoC 100 may include system components and resources 110 for managing sensor data, analog-to-digital conversions, wireless data transmissions, and for performing other specialized operations (e.g., decoding high-definition video, video processing, etc.). System components and resources 110 may also include components such as voltage regulators, oscillators, phase-locked loops, peripheral bridges, data controllers, system controllers, access ports, timers, and other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a universal serial bus (USB) controller 112, and one or more memory controllers 114 (e.g., a dynamic random access memory (DRAM) memory controller). The SoC 100 may also include an input/output module (not illustrated) for communicating with resources external to the SoC, such as a clock and a voltage regulator, each of which may be shared by two or more of the internal SoC components.

The processors 102, 104, 106, 108 may be interconnected to the USB controller 112, the memory controller 114, system components and resources 110, and other system components via an interconnection/bus module 122, which may include an array of reconfigurable logic gates and/or implement a bus architecture (e.g., CoreConnect, AMBA, etc.). Communications may also be provided by advanced interconnects, such as high performance networks-on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In an aspect, the bus module 122 may include a direct memory access (DMA) controller (not illustrated) that enables components connected to the bus module 122 to operate as a master component and initiate memory transactions. The bus module 122 may also implement an arbitration scheme to prevent multiple master components from attempting to drive the bus simultaneously.

The memory controller 114 may be a specialized hardware module configured to manage the flow of data to and from a memory 124. The memory controller 114 may include logic for interfacing with the memory 124, such as selecting a row and column in a cell array 132 of the memory 124 corresponding to a memory location, reading or writing data to the memory location, etc.

The memory 124 may be an on-chip component (e.g., on the substrate, die, integrated chip, etc.) of the SoC 100, or alternatively (as shown) an off-chip component. As shown the memory 124 includes an ECC module 130. The ECC module 130 is configured to implement an ECC logic for detecting and correcting errors in the memory 124 as discussed and known in the art. In certain aspects, the ECC module 130 is further configured to implement processes for self-testing the functionality of the ECC logic as discussed herein.

Figure 2:
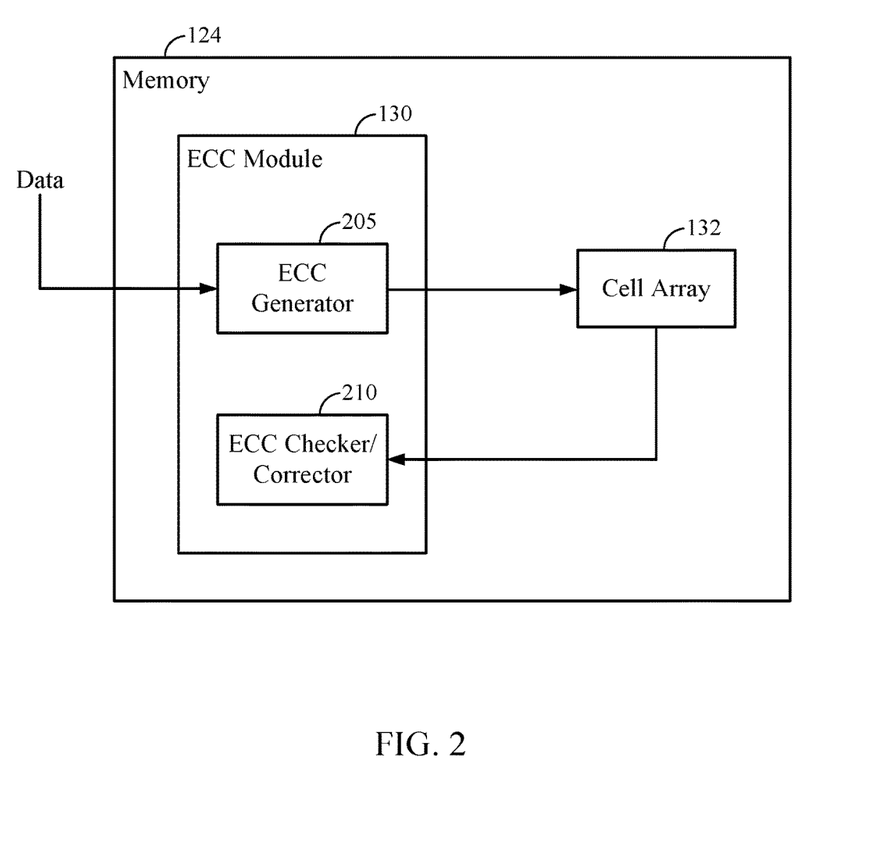
FIG. 2 illustrates example components and interconnections in the volatile memory of FIG. 1 suitable for implementing various aspects of the present disclosure.

FIG. 2 illustrates example components and interconnections in the volatile memory 124 suitable for implementing various aspects of the present disclosure. As shown in FIG. 2, the ECC module 130 includes an ECC generator 205 and an ECC checker/corrector 210. In certain aspects, when the ECC module is operating in a normal mode, the ECC generator 205 is configured to receive data for writing to cell array 132, such as from memory controller 114. The ECC generator 205 is further configured to generate checker bits (e.g., ECC bits) used for correcting errors in the received data when stored in cell array 132. For example, the checker bits may comprise a syndrome or other known ECC bits for correcting errors in data. The ECC generator 205, or the memory controller 114 directly, is configured to write the data to the cell array 132, and the ECC generator 205 is further configured to write the generated checker bits corresponding to the data in cell array 132.

Upon receiving a read command for the stored data (e.g., from the memory controller 114), the ECC checker/corrector 210 is configured to read the stored data and corresponding checker bits from the cell array 132. The ECC checker/corrector 210 is further configured to utilize the checker bits to check (e.g., using known ECC processes) if the read data includes any errors. If the read data includes any errors, the ECC checker/corrector 210 is further configured to utilize the checker bits to correct (e.g., using known ECC processes) the data. The ECC checker/corrector 210 then passes the data (e.g., checked/corrected data) to the memory controller 114 to pass to the appropriate component.

In certain aspects, the ECC module 130, in addition to having a normal mode of operation, may implement a test mode where the ECC module 130 is configured to perform a self-test of the ECC logic implemented by the ECC module 130. In certain aspects, the ECC module 130 is selectively configured to run in test mode. In certain aspects, the test mode is selectively enabled, such as by a user. In some aspects, the test mode may be configured (e.g., programmed) to be run periodically or at certain time intervals (e.g., every fault tolerant time interval (FTTI) such as for an ADAS application (e.g., 250 ms)) (e.g., based on a timer). When the test mode is not active, the ECC module 130 may function in the normal mode. In certain aspects, the test mode is selectively enabled for one or more particular address locations for data, which may be pre-programmed, user selectable, configurable, etc. For example, when data is sent to memory 124 for storage, it may also include an address indicating where in cell array 132 to store the data. In certain aspects, if data is received at the ECC module 130 for the one or more particular address locations, the ECC module 130 operates in the test mode with respect to the data. If data is received for a different address, the ECC module 130 operates in the normal mode.

In certain aspects, by only selectively configuring the ECC module 130 to run in test mode, the ECC module 130 can be configured to test the ECC logic of the ECC module 130 during runtime of the memory 124 (e.g., concurrently with normal operation of the memory 124). For example, in certain aspects, since the test mode may only be applied to data written to one or more particular addresses in cell array 132, the ECC logic of the ECC module 130 can be tested by writing data to the one or more particular addresses, while still operating normally for data written to other addresses. The one or more particular addresses, in certain aspects, may be reserved for testing the ECC logic of the ECC module 130, or may not be used for writing normal data for concurrent operation.

In certain aspects, in the test mode, the ECC module 130 is configured to receive data for testing the ECC logic (e.g., ECC generator 205 and/or ECC checker/corrector 210) of the ECC module 130 and test the ECC logic as follows. In particular, in certain aspects, the ECC generator 205 is configured to selectively invert at least one bit of the data (e.g., using an inverter and optionally a multiplexer) to generate inverted data (e.g., corrupted data) and store the inverted data in cell array 132. In certain aspects, which bit(s) of the data are inverted are dynamically selectable. Further, in certain aspects, the ECC generator 205 is configured to utilize the original received data to generate checker bits used for correcting errors in the data and store the checker bits in cell array 132. Accordingly, the ECC generator 255 stores data with at least one inverted bit, and checker bits corresponding to the original data. The ECC checker/corrector 210 is configured to then read the stored inverted data and corresponding checker bits from the cell array 132. The ECC checker/corrector 210 is further configured to utilize the checker bits to check/correct the retrieved inverted data and generate corrected data based on the checker bits and the inverted data. Since the checker bits correspond to the original data, and the inverted data corresponds to corrupted data, if the ECC checker/corrector 210 is functioning correctly, the ECC checker/corrector 210 identifies an error in the retrieved inverted data and corrects the inverted data to generate the original data (i.e., without the bit inversion). Accordingly, the ECC checker/corrector 210 is configured to compare the corrected data from the ECC checker/corrector 210 to the original data (e.g., stored locally in a cache at the ECC module 130). If the corrected data matches the original data, then the ECC logic of the ECC module 130 is performing correctly as it successfully corrected the error in the inverted data as compared to the original data. If the corrected data does not match the original data, the ECC logic of the ECC module 130 may not be functioning correctly. Accordingly, the ECC module 130 may be configured to generate an alert or error that indicates (e.g., to a user) that the ECC module 130 is not functioning correctly. For example, in some aspects, the ECC module 130 generates an interrupt to the SoC 100 to indicate the error. In some aspects, the ECC module 130 writes to a register indicating the error. The SoC 100 may be configured to read from the register to determine the error has occurred.

In certain aspects, in the test mode, instead of storing inverted data, and utilizing checker bits generated based on the original data to test the ECC logic of the ECC module 130, the ECC module 130 is configured to store the original data, and utilize checker bits generated based on the inverted data to test the ECC logic of the ECC module 130. For example, the ECC generator 205 is configured to selectively invert at least one bit of the data to generate inverted data (e.g., corrupted data). In certain aspects, which bit(s) of the data are inverted are dynamically selectable. Further, the ECC generator 205 is configured to utilize the inverted data to generate checker bits used for correcting errors in the data. The ECC generator 205 is further configured to store the original data and the checker bits in cell array 132. Accordingly, the ECC generator 255 stores the original data, and checker bits corresponding to the inverted data. The ECC checker/corrector 210 is configured to then read the stored original data and corresponding checker bits from the cell array 132. The ECC checker/corrector 210 is further configured to utilize the checker bits to check/correct the retrieved original data and generate corrected data based on the checker bits and the data. Since the checker bits correspond to the inverted data, if the ECC checker/corrector 210 is functioning correctly, the ECC checker/corrector 210 identifies an error in the retrieved original data and corrects the original data to generate the inverted data (i.e., with the bit inversion). Accordingly, the ECC checker/corrector 210 is configured to compare the corrected data from the ECC checker/corrector 210 to the inverted data (e.g., stored locally in a cache at the ECC module 130). If the corrected data matches the inverted data, then the ECC logic of the ECC module 130 is performing correctly as it successfully corrected the error in the original data as compared to the inverted data. If the corrected data does not match the inverted data, the ECC logic of the ECC module 130 may not be functioning correctly. Accordingly, the ECC module 130 may be configured to generate an alert or error that indicates (e.g., to a user) that the ECC module 130 is not functioning correctly. For example, in some aspects, the ECC module 130 generates an interrupt to the SoC 100 to indicate the error. In some aspects, the ECC module 130 writes to a register indicating the error. The SoC 100 may be configured to read from the register to determine the error has occurred.

In certain aspects, in the test mode, the ECC module 130 is configured to store the original data, and utilize checker bits generated based on the original data and then inverted to test the ECC logic of the ECC module 130. For example, the ECC generator 205 is configured to utilize the original data to generate checker bits used for correcting errors in the data. The ECC generator 205 is further configured to invert at least one bit of the checker bits. In certain aspects, which bit(s) of the data are inverted are dynamically selectable. The ECC generator 205 is further configured to store the original data in cell array 132 and the inverted checker bits in cell array 132. Accordingly, the ECC generator 255 stores the original data, and inverted checker bits corresponding to the data. The ECC checker/corrector 210 is configured to then read the stored original data and corresponding inverted checker bits from the cell array 132. The ECC checker/corrector 210 is further configured to utilize the inverted checker bits to check/correct the retrieved original data and generate corrected data based on the inverted checker bits and the data. For example, the ECC checker/corrector 210, based on known ECC processes, may also be configured to identify and correct errors in the checker bits themselves. Since the checker bits are inverted, if the ECC checker/ corrector 210 is functioning correctly, the ECC checker/corrector 210 identifies an error in the checker bits themselves and corrects the checker bits. Accordingly, the ECC checker/corrector 210 is configured to compare the corrected checker bits from the ECC checker/corrector 210 to the original checker bits (e.g., stored locally in a cache at the ECC module 130). If the corrected checker bits match the original checker bits, then the ECC logic of the ECC module 130 is performing correctly as it successfully corrected the error. If the corrected checker bits do not match the original checker bits, the ECC logic of the ECC module 130 may not be functioning correctly. Accordingly, the ECC module 130 may be configured to generate an alert or error that indicates (e.g., to a user) that the ECC module 130 is not functioning correctly. For example, in some aspects, the ECC module 130 generates an interrupt to the SoC 100 to indicate the error. In some aspects, the ECC module 130 writes to a register indicating the error. The SoC 100 may be configured to read from the register to determine the error has occurred.

Figure 3:
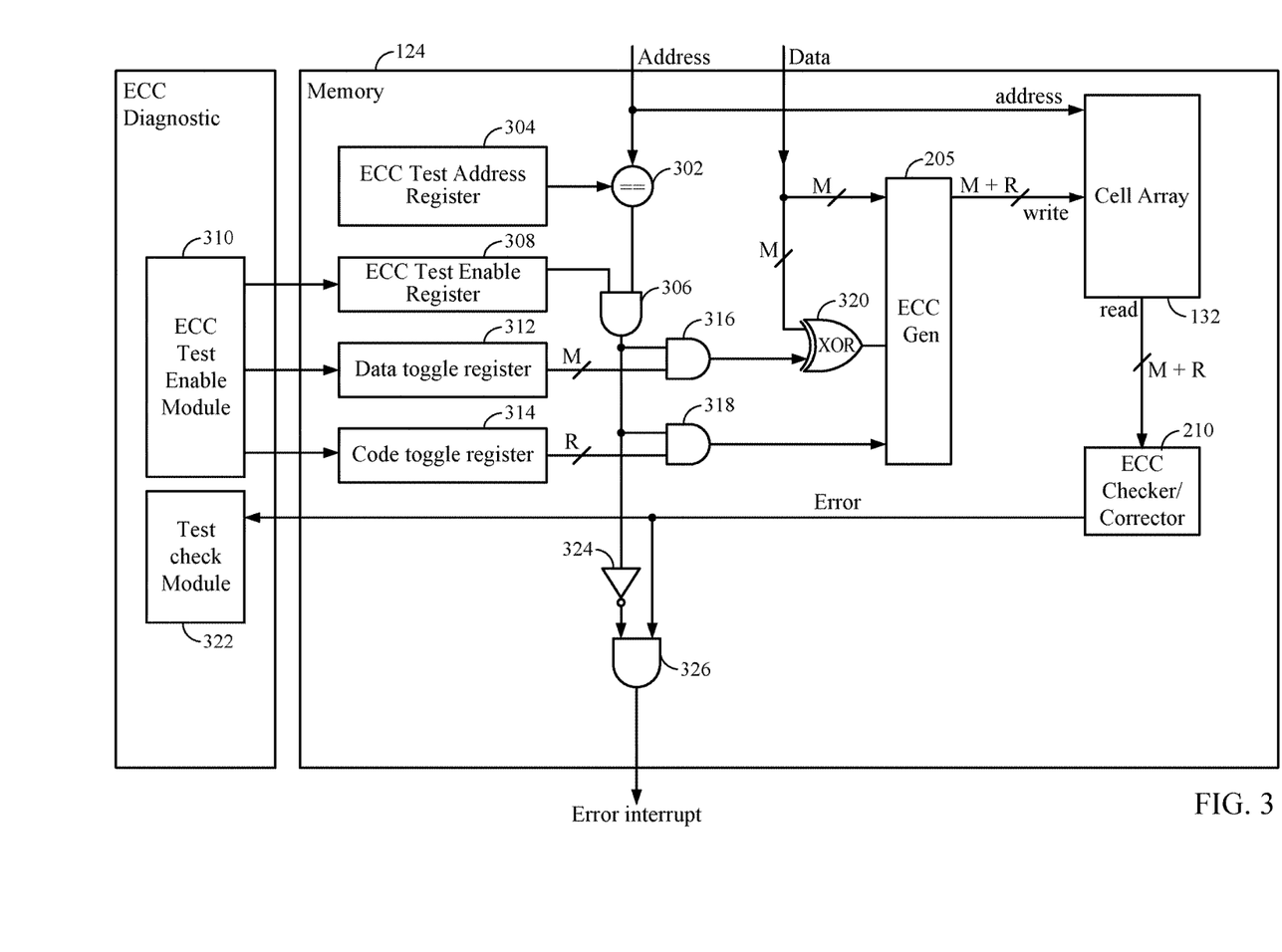
FIG. 3 illustrates example components and interconnections in the volatile memory of FIG. 2 suitable for implementing various aspects of the present disclosure.

FIG. 3 illustrates example components and interconnections in the volatile memory 124 suitable for implementing various aspects of the present disclosure.

As shown, memory 124 includes the ECC generator 205, the ECC checker/corrector 210, and cell array 132. The memory 124 further includes hardware for selectively enabling a test mode of the ECC module including ECC generator 205 and the ECC checker/corrector 210. For example, the memory 124 includes a comparator 302 coupled to an address line (e.g., from memory controller 114) configured to carry address information for where data (e.g., from the memory controller 114) is to be stored in cell array 132. The comparator 302 is further coupled to an ECC test address register 304 (e.g., a software programmable register) configured to store information indicative of one or more address locations where if data is received for storage in the one or more address locations, the ECC module operates in test mode. If the address information received by the comparator 302 on the address line matches an address stored in the ECC test address register 304, the comparator 302 outputs a test mode enable signal indicating to enable test mode. If the address information received by the comparator 302 on the address line does not match an address stored in the ECC test address register 304, the comparator 302 outputs a test mode enable signal indicating to not enable test mode.

The output of the comparator 302 is coupled to a first input of an AND gate 306. A second input of the AND gate 306 is coupled to an ECC test enable register 308. The ECC test enable register 308 may output a signal indicating to enable test mode or disable test mode based on an enable value stored in the ECC test enable register 308. The value in the ECC test enable register 308 may be set by an ECC test enable module 310, which may be on-chip or off-chip from the memory 124. The ECC test enable module 310 may be configured to selectively (e.g., periodically) set the value to selectively enable and disable the test mode as discussed.

The output of the AND gate 306 may indicate to operate the memory 124 in test mode when both the ECC test enable register 308 indicates to enable test mode and the comparator 302 outputs a test mode enable signal indicating to enable test mode. Otherwise, the output of the AND gate 306 may indicate to operate the memory 124 in normal mode.

The memory 124 further includes a data toggle register 312 and a code toggle register 314. The data toggle register 312 may be configured to store a value indicating which bit(s), if any, of the data to invert as discussed. The code toggle register 314 may be configured to store a value indicating which bit(s), if any, of the checker bits to invert as discussed. The values may be set by the ECC test enable module 310.

The output of the data toggle register 312 is coupled to a first input of an AND gate 316. A second input of the AND gate 316 is further coupled to an output of the AND gate 306. Similarly, the output of the code toggle register 314 is coupled to a first input of an AND gate 318. A second input of the AND gate 318 is further coupled to an output of the AND gate 306.

The output of the AND gate 316 is coupled to a first input of a XOR gate 320. A second input of the XOR gate 320 is coupled to a data line (e.g., from memory controller 114) configured to carry data information to be stored in cell array 132. Further, the output of the XOR gate 320 is coupled to the ECC generator 205. Further, the output of the AND gate 318 is coupled to the ECC generator 205. In addition, the data line is directly coupled to the ECC generator 205.

Accordingly, when the output of the AND gate 306 indicates to operate the memory 124 in normal mode (e.g., has a value of all 0s), then the values output from AND gates 316 and 318 are 0. Accordingly, the value output from the XOR gate 320 is the actual data on the data line, and the 0 value from AND gate 318 indicates not to invert any checker bits. Accordingly, the ECC generator 205 operates in normal mode and does not invert any bits of the data or checker bits.

When the output of the AND gate 306 indicates to operate the memory 124 in test mode (e.g., has a value of all 1s), then the values output from the AND gates 316 and 318 correspond to the at least one bit to invert of the data or checker bits. Accordingly, if the data toggle register 312 indicates bits to invert of the data, the XOR gate 320 functions to invert those bits and sends the inverted data to the ECC generator 205. If the code toggle register 314 indicates bits to invert of the checker bits, the ECC generator 205 receives the information and inverts the checker bits.

The cell array 132 is further coupled to the output of the ECC generator 205, and to the address line. Accordingly, the ECC generator 205 writes data (e.g., original data or inverted data) to the address indicated on the address line and corresponding checker bits (e.g., inverted data checker bits, original checker bits, inverted checker bits) as discussed. The cell array 132 is further coupled to the ECC checker/corrector 210. The ECC checker/corrector 210 is coupled to a test check module 322. The test check module may be configured to cause the ECC checker/corrector 210 to read the data and checker bits from memory and perform comparisons as discussed herein to determine if the ECC logic is functioning correctly when the test mode is enabled.

The ECC checker/corrector 210 may be configured to output an error signal when the ECC checker/corrector 210 detects an error in the checker bits or data based on known ECC processes. The output of the ECC checker/corrector 210 may be coupled to a first input of an AND gate 326. Further, in certain aspects, the output of the AND gate 306 is further coupled to an inverter 324, which is coupled to a second input of the AND gate 326. In certain aspects, the output of the AND gate 326 is configured to control generation of an interrupt signal indicating an error detected in the checker bits or data based on known ECC processes. Normally, an ECC memory may be configured to generate an interrupt (e.g., to a user) when an error is detected in data. In some aspects, the memory 124 is configured to suspend generation of an interrupt with respect to data on which the test process is run to avoid alerts for test data. For example, when in test mode, the output of the AND gate 306 is 1, which is inverted by inverter 324 to 0, so the output of the AND gate 326 is always 0, indicating no interrupt is generated. When in normal mode, the input to AND gate 326 from AND gate 306 is 1 (inversion of 0), so the interrupt is passed as generated by ECC checker/corrector 210.

Figure 4:
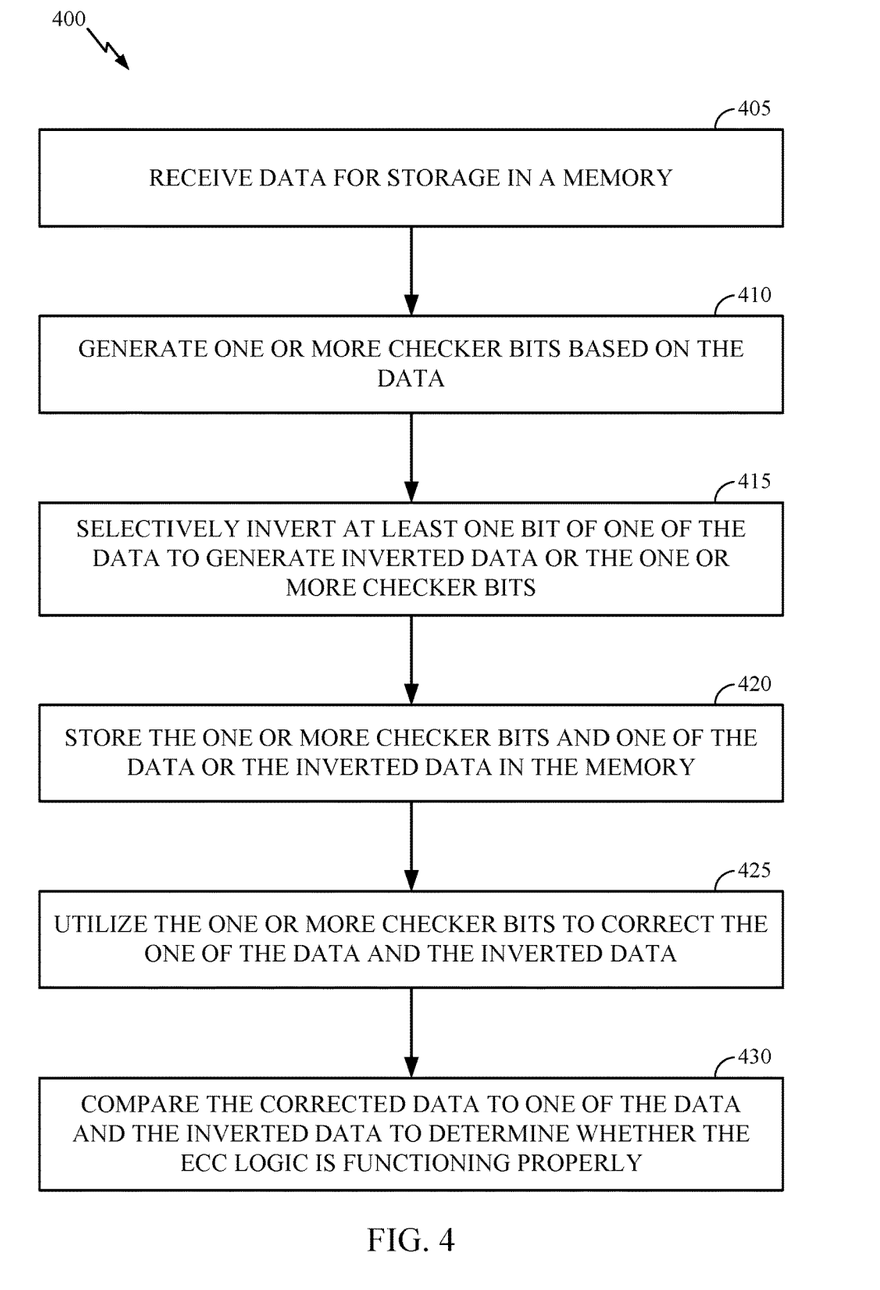
FIG. 4 illustrates example operations for testing error correcting code (ECC) logic.

FIG. 4 illustrates example operations 400 for testing error correcting code (ECC) logic. Operations 400 may be performed by one or more components associated with a memory, such as ECC module 130, ECC generator 205, and/or ECC checker/corrector 210.

At 405, data is received for storage in a memory. At 410, one or more checker bits are generated based on the data (e.g., for the data or an inversion of the data). At 415, at least one bit of one of the data to generate inverted data or the one or more checker bits is selectively inverted. At 420, the one or more checker bits and one of the data or the inverted data are stored in the memory. At 425, the one or more checker bits are utilized to correct the one of the data and the inverted data. At 430, the corrected data is compared to one of the data and the inverted data to determine whether the ECC logic is functioning properly.

Figure 5:
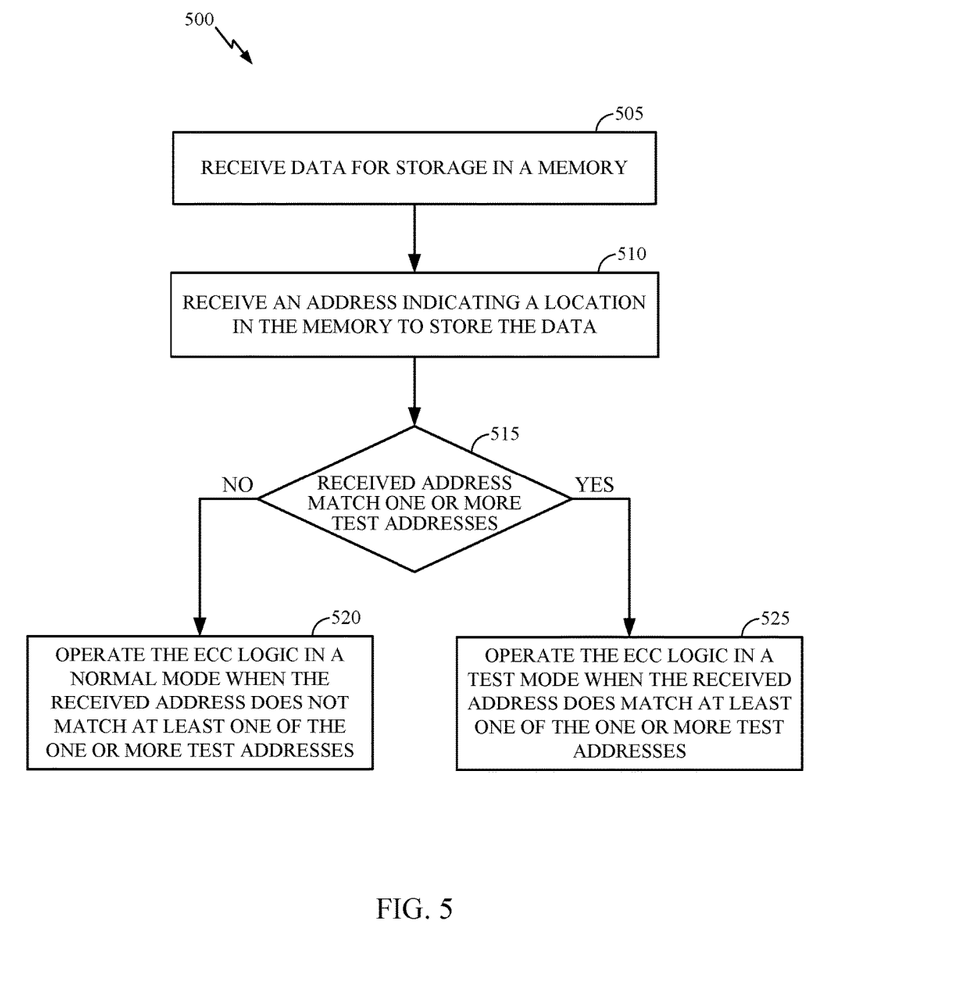
FIG. 5 illustrates example operations for testing error correcting code (ECC) logic.

FIG. 5 illustrates example operations 500 for testing error correcting code (ECC) logic. Operations 500 may be performed by one or more components associated with a memory, such as ECC module 130, ECC generator 205, and/or ECC checker/corrector 210.

At 505, data is received for storage in a memory. At 510, an address indicating a location in the memory to store the data is received. At 515, it is determined if the received address matches at least one of one or more test addresses.

If at 515, the received address does not match at least one of the one or more test addresses, the operations 500 continue to 520. At 520, the ECC logic is operated in a normal mode when the received address does not match at least one of the one or more test addresses.

If at 515, the received address does match at least one of the one or more test addresses, the operations 500 continue to 525. At 525, the ECC logic is operated in a test mode when the received address does match at least one of the one or more test addresses.

In some configurations, the term(s) 'communicate,' 'communicating,' and/or 'communication' may refer to 'receive,' 'receiving,' 'reception,' and/or other related or suitable aspects without necessarily deviating from the scope of the present disclosure. In some configurations, the term(s) 'communicate,' 'communicating,' 'communication,' may refer to 'transmit,' 'transmitting,' 'transmission,' and/or other related or suitable aspects without necessarily deviating from the scope of the present disclosure.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features and/or functions illustrated herein may be rearranged and/or combined into a single component, step, feature or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." For example, the ECC generator 205 may include a receiving component or one or more components to provide the means for receiving data for storage in a memory. Additionally, ECC generator 205 may include an checker bit generating component or one or more components to provide the means for generating one or more checker bits. Further, the ECC generator 205 may include an inverting component or one or more components to provide the means for inverting. In some cases, memory 124 may provide means for storing. In some cases, the ECC checker/corrector 210 may provide means for utilizing checker bits to correct data. In some cases, the ECC checker/corrector 210 may provide means for comparing.

These apparatus and methods described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

What is claimed is:

1. A method of testing error-correcting code (ECC) logic, the method comprising:
   receiving data for storage in a memory;
   receiving an address indicating a location in the memory to store the data;
   determining if the received address matches at least one of one or more test addresses;
   operating the ECC logic in a normal mode when the received address does not match at least one of the one or more test addresses; and
   operating the ECC logic in a test mode when the received address does match at least one of the one or more test addresses.

2. The method of claim 1, wherein operating the ECC logic in the test mode comprises:
   generating one or more checker bits based on the data;
   selectively inverting at least one bit of one of the data to generate inverted data or the one or more checker bits;
   storing one of the data or the inverted data;
   storing the one or more checker bits;
   utilizing the one or more checker bits to correct the one of the data or the inverted data and generate corrected data; and
   comparing the corrected data to the data or the inverted data to determine whether the ECC logic is functioning properly.

3. The method of claim 2, wherein selectively inverting comprises selectively inverting at least one bit of the data to generate the inverted data, wherein generating one or more checker bits comprises generating the one or more checker bits using the data, wherein storing comprises storing the inverted data, wherein comparing comprises comparing the corrected data to the data.

4. The method of claim 2, wherein selectively inverting comprises selectively inverting at least one bit of the data to generate the inverted data, wherein generating one or more checker bits comprises generating the one or more checker bits using the inverted data, wherein storing comprises storing the data, wherein comparing comprises comparing the corrected data to the inverted data.

5. The method of claim 2, wherein selectively inverting comprises selectively inverting at least one bit of one or more checker bits, wherein generating one or more checker bits comprises generating the one or more checker bits using the data, wherein storing comprises storing the data, wherein the corrected data comprises corrected one or more checker bits, and wherein comparing comprises comparing the corrected data to the one or more checker bits.

6. The method of claim 2, further comprising generating an alert indicating the ECC logic is not functioning properly if the comparison indicates the ECC logic is not functioning properly.

7. The method of claim 1, wherein operating the ECC logic in the test mode or the normal mode is further based on a timer.

8. The method of claim 1, further comprising selectively generating interrupts based on operating the ECC logic in the test mode or the normal mode.

9. The method of claim 1, further comprising generating interrupts when reading and checking the data only when the received address does not match at least one of the one or more test addresses.

10. The method of claim 1, further comprising concurrently operating the ECC logic in the normal mode and the test mode.

11. The method of claim 1, further comprising dynamically selecting the one or more test addresses.

12. A memory module for testing error-correcting code (ECC) logic, the memory module comprising:
   an ECC logic configured to receive data for storage in a memory; and
   an ECC module configured to:
      receive an address indicating a location in the memory to store the data;
      determine if the received address matches at least one of one or more test addresses;
      operate the ECC logic in a normal mode when the received address does not match at least one of the one or more test addresses; and
      operate the ECC logic in a test mode when the received address does match at least one of the one or more test addresses.

13. The memory module of claim 12, wherein the ECC module being configured to operate the ECC logic in the test mode comprises the ECC module being configured to operate the ECC logic to:
   generate one or more checker bits based on the data;
   selectively invert at least one bit of one of the data to generate inverted data or the one or more checker bits;
   store one of the data or the inverted data;

store the one or more checker bits;
utilize the one or more checker bits to correct the one of the data or the inverted data and generate corrected data; and
compare the corrected data to the data or the inverted data to determine whether the ECC logic is functioning properly.

14. The memory module of claim 13, wherein to selectively invert comprises to selectively invert at least one bit of the data to generate the inverted data, wherein to generate one or more checker bits comprises to generate the one or more checker bits using the data, wherein to store comprises to store the inverted data, wherein to compare comprises compare the corrected data to the data.

15. The memory module of claim 13, wherein to selectively invert comprises to selectively invert at least one bit of the data to generate the inverted data, wherein to generate one or more checker bits comprises to generate the one or more checker bits using the inverted data, wherein to store comprises to store the data, wherein to compare comprises to compare the corrected data to the inverted data.

16. The memory module of claim 13, wherein to selectively invert comprises to selectively invert at least one bit of one or more checker bits, wherein to generate one or more checker bits comprises to generate the one or more checker bits using the data, wherein to store comprises to store the data, wherein the corrected data comprises corrected one or more checker bits, and wherein to compare comprises to compare the corrected data to the one or more checker bits.

17. The memory module of claim 13, wherein the ECC module is further configured to generate an alert indicating the ECC logic is not functioning properly if the comparison indicates the ECC logic is not functioning properly.

18. The memory module of claim 12, wherein to operate the ECC logic in the test mode or the normal mode is further based on a timer.

19. The memory module of claim 12, wherein the ECC logic is further configured to generate interrupts based on operating the ECC logic in the test mode or the normal mode.

20. The memory module of claim 12, wherein the ECC logic is further configured to generate interrupts when reading and checking the data only when the received address does not match at least one of the one or more test addresses.

21. The memory module of claim 12, wherein the ECC module is further configured to concurrently operate the ECC logic in the normal mode and the test mode.

22. The memory module of claim 12, wherein the ECC module is further configured to dynamically select the one or more test addresses.

23. A memory module for testing error-correcting code (ECC) logic, the memory module comprising:
means for receiving data for storage in a memory;
means for receiving an address indicating a location in the memory to store the data;
means for determining if the received address matches at least one of one or more test addresses;
means for operating the ECC logic in a normal mode when the received address does not match at least one of the one or more test addresses; and
means for operating the ECC logic in a test mode when the received address does match at least one of the one or more test addresses.

24. The memory module of claim 23, wherein means for operating the ECC logic in the test mode comprises:
means for generating one or more checker bits based on the data;
means for selectively inverting at least one bit of one of the data to generate inverted data or the one or more checker bits;
means for storing one of the data or the inverted data;
means for storing the one or more checker bits;
means for utilizing the one or more checker bits to correct the one of the data or the inverted data and generate corrected data; and
means for comparing the corrected data to the data or the inverted data to determine whether the ECC logic is functioning properly.

25. The memory module of claim 24, wherein means for selectively inverting comprises means for selectively inverting at least one bit of the data to generate the inverted data, wherein means for generating one or more checker bits comprises means for generating the one or more checker bits using the data, wherein means for storing comprises means for storing the inverted data, wherein means for comparing comprises means for comparing the corrected data to the data.

26. The memory module of claim 24, wherein means for selectively inverting comprises means for selectively inverting at least one bit of the data to generate the inverted data, wherein means for generating one or more checker bits comprises means for generating the one or more checker bits using the inverted data, wherein means for storing comprises means for storing the data, wherein means for comparing comprises means for comparing the corrected data to the inverted data.

27. A non-transitory computer readable medium having instructions stored thereon for causing a memory module to perform a method of testing error-correcting code (ECC) logic, the method comprising:
receiving data for storage in a memory;
receiving an address indicating a location in the memory to store the data;
determining if the received address matches at least one of one or more test addresses;
operating the ECC logic in a normal mode when the received address does not match at least one of the one or more test addresses; and
operating the ECC logic in a test mode when the received address does match at least one of the one or more test addresses.

28. The non-transitory computer readable medium of claim 27, wherein operating the ECC logic in the test mode comprises:
generating one or more checker bits based on the data;
selectively inverting at least one bit of one of the data to generate inverted data or the one or more checker bits;
storing one of the data or the inverted data;
storing the one or more checker bits;
utilizing the one or more checker bits to correct the one of the data or the inverted data and generate corrected data; and
comparing the corrected data to the data or the inverted data to determine whether the ECC logic is functioning properly.

29. The non-transitory computer readable medium of claim 28, wherein selectively inverting comprises selectively inverting at least one bit of the data to generate the inverted data, wherein generating one or more checker bits comprises generating the one or more checker bits using the data, wherein storing comprises storing the inverted data, wherein comparing comprises comparing the corrected data to the data.

30. The non-transitory computer readable medium of claim 28, wherein selectively inverting comprises selectively inverting at least one bit of the data to generate the inverted data, wherein generating one or more checker bits comprises generating the one or more checker bits using the inverted data, wherein storing comprises storing the data, wherein comparing comprises comparing the corrected data to the inverted data.

* * * * *